United States Patent [19]

Tomomatsu

[11] Patent Number: 5,355,003
[45] Date of Patent: Oct. 11, 1994

[54] SEMICONDUCTOR DEVICE HAVING STABLE BREAKDOWN VOLTAGE IN WIRING AREA

[75] Inventor: Yoshifumi Tomomatsu, Fukuoka, Japan

[73] Assignee: Mitsubishi Denki Kabushiki Kaisha, Tokyo, Japan

[21] Appl. No.: 85,058

[22] Filed: Jul. 2, 1993

[30] Foreign Application Priority Data

Aug. 5, 1992 [JP] Japan .................... 4-208890

[51] Int. Cl.$^5$ ............... H01L 29/70; H01L 29/72
[52] U.S. Cl. ..................... 257/139; 257/138; 257/140
[58] Field of Search ............. 257/140, 138, 139, 147, 257/145

[56] References Cited

FOREIGN PATENT DOCUMENTS 2-206174  8/1990  Japan .
0338880  2/1991  Japan .

Primary Examiner—Rolf Hille
Assistant Examiner—Wael Fahmy
Attorney, Agent, or Firm—Oblon, Spivak, McClelland, Maier & Neustadt

[57] ABSTRACT

In order to obtain a semiconductor device which can suppress a surge voltage and a method of fabricating the same, a thickness (d4–d5) and impurity concentration of an N$^-$-type layer (4) provided under a P-type base region (5) are so set as to reliably prevent a depletion layer extending from a P-N junction formed in the interface between the P-type base region (5) and the N$^-$-type layer 4 from reaching an N$^+$-type buffer layer 2 in a turn-off time. Thus, it is possible to suppress a surge voltage caused in an actual operation.

7 Claims, 17 Drawing Sheets

SEMICONDUCTOR DEVICE HAVING STABLE BREAKDOWN VOLTAGE IN WIRING AREA

BACKGROUND OF THE INVENTION

1. Field of the Invention

The present invention relates to a semiconductor device and a method of fabricating the same, and more particularly, it relates to a vertical field effect semiconductor device and a method of fabricating the same.

2. Description of the Background Art

FIG. 22 is a sectional view showing the structure of a conventional N-channel IGBT. As shown in FIG. 22, an N+-type buffer layer 2 is formed on a P+-type substrate 1, and an N−-type layer 4 is formed on the N+-type buffer layer 2.

P-type base regions 5 are selectively formed in a surface of the N−-type layer 4, and N-type emitter regions 6 are selectively formed in surfaces of the P-type base regions 5. A gate insulating film 8 is formed end portions of the emitter regions 6 located on the P-type base regions 5, so that a gate electrode 9 is formed on this gate insulating film 8. Namely, an N-channel DMOS (diffusion self-alignment MOS) is formed on the surface of the N−-type layer 4.

Further, emitter electrodes 10 are formed on parts of the P-type base regions 5 and the N-type emitter regions 6, while a collector electrode 11 is formed on a rear surface of the P+-type substrate 1.

In such a structure, a collector voltage $V_{CE}$ of a prescribed level is applied across the emitter electrodes 10 and the collector electrode 11 while grounding the emitter side, and a gate voltage $V_{GE}$ of an operating level is applied across the gate electrode 9 and the emitter electrodes 10. Thus, channel regions 7, which are surface regions of the P-type base regions 5 located under the gate electrode 9, are inverted to N-type regions. Therefore, electrons from the emitter electrodes 10 are injected into the N−-type layer 4 through the channel regions 7. The P+-type substrate 1 and the N−-type layer 4 are forward biased by the electrons injected into the N−-type layer 4. As a result, the P+-type substrate 1 injects holes into the N−-type layer 4, whereby resistance of the N−-type layer 4 is extremely reduced and current capacitance of the device is increased. This is an ON state of the IGBT.

When a gate voltage of a non-operating level is applied to the gate electrode 9, on the other hand, the channel regions 7 return to P-type regions to shift the IGBT to an OFF state. In this case, a certain degree of time is required for disappearance of the holes injected into the N−-type layer 4. Namely, a prescribed time from application of the non-operating level gate voltage to the gate electrode 9 to complete disappearance of the holes in the N−-type layer 4 and the N+-type buffer layer 2 is required for completely stopping the current flowing in the IGBT during a turn-off operation time.

The N+-type buffer layer 2 functions as a lifetime killer for controlling the holes injected into the N−-type layer 4, so that the turn-off time can be reduced by presence of this N+-type buffer layer 2. The N+-type buffer layer 2 is also adapted to suppress depletion layers extending from P-N junctions formed in interfaces between the P-type base regions 5 and the N−-type layer 4 toward the N−-type layer 4 in an OFF state of the IGBT, whereby the N−-type layer 4 can be reduced in thickness.

It has been empirically recognized that a surge voltage (emitter-to-collector voltage $V_{CE}$) is increased in a turn-off state of an IGBT having such a conventional structure.

A typical IGBT of such a conventional structure is a 600 V system IGBT which operates with a collector-to-emitter voltage $V_{CE}$ of 300 V, whose N−-type layer 4 has resistivity $\rho$ of 30Ω cm (impurity concentration: $1.57 \times 10^{14}$ cm$^{-3}$) and a thickness of 60 μm.

The inventor experimentally fabricated an IGBT of 100 A having a conventional structure, to evaluate a surge voltage in a switching-off state of the IGBT in a half bridge circuit, under measurement conditions of $V_{CE}=300$ V, $V_{GE}=\pm15$ V and a junction temperature (device temperature) of 125° C.

As the result, a relatively large surge voltage of about 550 V was measured. From the result of this experiment, it has been proved that such an IGBT of a conventional structure cannot suppress a surge voltage in a turn-off state.

SUMMARY OF THE INVENTION

In a first aspect of the present invention, a semiconductor device comprises a first conductivity type first semiconductor layer having one major surface and another major surface, a first conductivity type second semiconductor layer which is formed on the one major surface of the first semiconductor layer and having lower impurity concentration than the first semiconductor layer, a second conductivity type third semiconductor layer which is formed on a surface of the second semiconductor layer, a first main electrode which is formed on the third semiconductor layer, and a second main electrode which is formed on the other major surface of the first semiconductor layer, while the thickness of the third semiconductor layer, and the thickness and impurity concentration of the second semiconductor layer are set so as to satisfy the following conditional expression:

$$D > W$$

assuming that D represents the thickness of the second semiconductor layer which is located under the third semiconductor layer, BV represents a reverse bias voltage which is applied across the first and second main electrodes in an actual operation, KS represents the relative dielectric constant of a semiconductor material in the second semiconductor layer, $\epsilon 0$ represents the dielectric constant of a vacuum, q represents the amount of charges of electrons, N represents impurity concentration of the second semiconductor layer, and W represents extension of a depletion layer in reverse bias setting of a P-N junction formed in the interface between the second and third semiconductor layers, which is determined by the following equation (1):

$$W = \sqrt{\frac{2 \cdot KS \cdot \epsilon 0}{q \cdot N} BV} \tag{1}$$

Preferably, the semiconductor device further comprises a first conductivity type fourth semiconductor layer which is selectively formed in a surface of the third semiconductor layer, an insulating film formed on a surface portion of the third semiconductor layer which is located between the fourth and second semiconductor layers, and a control electrode which is formed on the insulating film, while the first main electrode is an electrode formed on the third and fourth semiconductor layers, the semiconductor device further comprises a second conductivity type semiconductor substrate which is formed on the other major surface of the first semiconductor layer, and the second main electrode is an electrode formed on the semiconductor substrate.

Preferably, a surface portion of the third semiconductor layer which is located under the insulating film serves as a channel region in a MOS operation with the control electrode serving as a gate electrode.

Preferably, the third semiconductor layer includes a plurality of third semiconductor layers, and the fourth semiconductor layer is provided on a surface of each of the third semiconductor layers.

Preferably, the first main electrode is an emitter electrode and the second main electrode is a collector electrode.

Preferably, the first conductivity type is an N-type and the second conductivity type is a P-type.

In a second aspect of the present invention, a semiconductor device comprises a first conductivity type first semiconductor layer having one major surface and another major surface, a first conductivity type intermediate semiconductor layer which is formed on the one major surface of the first semiconductor layer and having lower impurity concentration than the first semiconductor layer, a first conductivity type second semiconductor layer which is formed on the intermediate semiconductor layer and having lower impurity concentration than the intermediate semiconductor layer, a second conductivity type third semiconductor layer which is formed on a surface of the second semiconductor layer, a first main electrode which is formed on the third semiconductor layer, and a second main electrode which is formed on the other major surface of the first semiconductor layer, while the thickness of the third semiconductor layer, the thickness and impurity concentration of the second semiconductor layer, and the thickness and impurity concentration of the intermediate semiconductor layer are so set as to satisfy the following conditional expression:

$$D' > W'$$

assuming that D' represents the total thickness of the semiconductor layer which is located under the third semiconductor layer and the intermediate semiconductor layer, BV represents a reverse bias voltage which is applied across the first and second main electrodes in an actual operation, KS represents the relative dielectric constant of a semiconductor material in the second semiconductor layer, $\epsilon 0$ represents the dielectric constant of a vacuum, q represents the amount of charges of electrons, N1 represents impurity concentration of the first semiconductor layer, N2 represents impurity concentration of the second semiconductor layer, BV1 represents a reverse bias voltage which is shared across the second and third semiconductor layers, and W' represents an extension of a depletion layer in reverse bias setting of a P-N junction formed in the interface between the second and third semiconductor layers, which is determined by the following equations (2):

$$W' = W1 + W2 \quad (2)$$

-continued $$W1 = \sqrt{\frac{2 \cdot KS \cdot \epsilon 0}{q \cdot N1} BV1}$$

$$W2 = \sqrt{\frac{2 \cdot KS \cdot \epsilon 0}{q \cdot N2} (BV - BV1)}$$

The present invention is also directed to a method of fabricating a semiconductor device. In a third aspect of the present invention, the method comprises the steps of (a) preparing a first conductivity type first semiconductor layer having one major surface and another major surface, (b) forming a first conductivity type second semiconductor layer, which is set to be lower in first conductivity type impurity concentration than the first semiconductor layer, on the one major surface of the second semiconductor layer, (c) forming a first conductivity type third semiconductor layer on a surface of the second semiconductor layer, (d) forming a first main electrode on the third semiconductor layer, and (e) forming a second main electrode on the other major surface of the first semiconductor layer, while the thickness of the third semiconductor layer, and the thickness and impurity concentration of the second semiconductor layer are so set as to satisfy the following conditional expression:

$$D > W$$

assuming that D represents the thickness of the second semiconductor layer which is located under the third semiconductor layer, BV represents a reverse bias voltage which is applied across the first and second main electrodes in an actual operation, KS represents the relative dielectric constant of a semiconductor material in the second semiconductor layer, $\epsilon 0$ represents the dielectric constant of a vacuum, q represents the amount of charges of electrons, N represents impurity concentration of the second semiconductor layer, and W represents extension of a depletion layer in reverse bias setting of a P-N junction formed in the interface between the second and third semiconductor layers, which is determined by the following equation (3):

$$W = \sqrt{\frac{2 \cdot KS \cdot \epsilon 0}{q \cdot N} BV} \quad (3)$$

Preferably, the step (a) comprises the steps of (a-1) preparing a second conductivity type semiconductor substrate having one major surface and another major surface, and (a-2) forming the first semiconductor layer on the one major surface of the semiconductor substrate, the method further comprises the steps of (h) selectively forming an insulating film on the second semiconductor layer, and (i) forming a control electrode on the insulating film, the step (c) comprises the step of (c-1) selectively implanting a second conductivity type impurity into a surface of the second semiconductor layer through masks of the insulating film and the control electrode and heat treating the same thereby forming the third semiconductor layer so that a part of the third semiconductor layer is formed under the insulating film by thermal diffusion, the method further comprises the step of (j) forming a first conductivity type fourth semiconductor layer on a surface of the third semiconductor layer through masks of the insulating film and the control electrode, the step (d) comprises the step of (d-1) forming the first main electrode on the third and fourth semiconductor layers, and the step (e) comprises the step of (e-1) forming the second main electrode on the other major surface of the semiconductor substrate.

Preferably, a surface portion of the third semiconductor layer which is located under the insulating film serves as a channel region in a MOS operation employing the control electrode as a gate electrode.

Preferably, the third semiconductor layer includes a plurality of third semiconductor layers, and the fourth semiconductor layer is formed on a surface of each of the third semiconductor layers.

Preferably, the first main electrode is an emitter electrode, and the second main electrode is a collector electrode.

Preferably, the first conductivity type is an N-type, and the second conductivity type is a P-type.

In a fourth aspect of the present invention, a method of fabricating a semiconductor device comprises the steps of (a) preparing a first conductivity type first semiconductor layer having one major surface and another major surface, (b) forming a first conductivity type intermediate semiconductor layer having lower impurity concentration than the first semiconductor layer on the one major surface of the first semiconductor layer, (c) forming a first conductivity type second semiconductor layer having lower impurity concentration than the intermediate semiconductor layer on the intermediate semiconductor layer, (d) forming a second conductivity type third semiconductor layer on a surface of the second semiconductor layer, (e) forming a first main electrode on the third semiconductor layer, and (f) forming a second main electrode on the other major surface of the first semiconductor layer, while the thickness of the third semiconductor layer, the thickness and impurity concentration of the second semiconductor layer, and the thickness and impurity concentration of the intermediate semiconductor layer are so set as to satisfy the following conditional expression:

$$D' > W'$$

assuming that $D'$ represents the total thickness of the second semiconductor layer which is located under the third semiconductor layer and the intermediate semiconductor layer, BV represents a reverse bias voltage which is applied across the first and second main electrodes in an actual operation, KS represents the relative dielectric constant of a semiconductor material in the second semiconductor layer, $\epsilon 0$ represents the dielectric constant of a vacuum, q represents the amount of charges of electrons, N1 represents impurity concentration of the first semiconductor layer, N2 represents impurity concentration of the second semiconductor layer, BV1 represents a reverse bias voltage which is shared across the second and third semiconductor layers, and $W'$ represents extension of a depletion layer in reverse bias setting of a P-N junction formed in the interface between the second and third semiconductor layers, which is determined by the following equations (4):

$$W = W1 + W2 \tag{4}$$

-continued $$W1 = \sqrt{\frac{2 \cdot KS \cdot \epsilon 0}{q \cdot N1} BV1}$$

$$W2 = \sqrt{\frac{2 \cdot KS \cdot \epsilon 0}{q \cdot N2} (BV - BV1)}$$

In the semiconductor device according to the first aspect of the present invention, which is fabricated by the method according to the third aspect of the present invention, the thickness of the third semiconductor layer, and the thickness and impurity concentration of the second semiconductor layer are so set that the thickness D of the semiconductor layer which is located under the third semiconductor layer satisfies $D > W$ with respect to extension W of a depletion layer in reverse bias setting of a P-N junction formed in the interface between the second and third semiconductor layers, whereby the depletion layer extending from the P-N junction will not reach the first semiconductor layer through the second semiconductor layer even if a reverse bias voltage BV is applied from the first and second main electrodes to the P-N junction.

Therefore, it is possible to suppress a surge voltage which is caused when a reverse bias voltage is instantaneously applied to the P-N junction formed in the interface between the second and third semiconductor layers.

In the semiconductor device according to the second aspect of the present invention, which is fabricated by the method according to the fourth aspect of the present invention, the thickness of the third semiconductor layer, the thickness and impurity concentration of the second semiconductor layer, and the thickness and impurity concentration of the intermediate semiconductor layer are so set that the total thickness $D'$ of the thickness D of the second semiconductor layer which is located under the third semiconductor layer and that of the intermediate semiconductor layer satisfies $D' > W'$ with respect to extension $W'$ of a depletion layer in reverse bias setting of the P-N junction formed in the interface between the second and third semiconductor layers, whereby the depletion layer extending from the P-N junction will not reach the first semiconductor layer through the second semiconductor layer and the intermediate semiconductor layer even if a reverse bias voltage BV is applied from the first and second main electrodes to the P-N junction.

Therefore, it is possible to suppress a surge voltage which is caused when a reverse bias voltage is instantaneously applied to the P-N junction formed in the interface between the second and third semiconductor layers.

Accordingly, an object of the present invention is to provide a semiconductor device which can suppress a surge voltage, and a method of fabricating the same.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
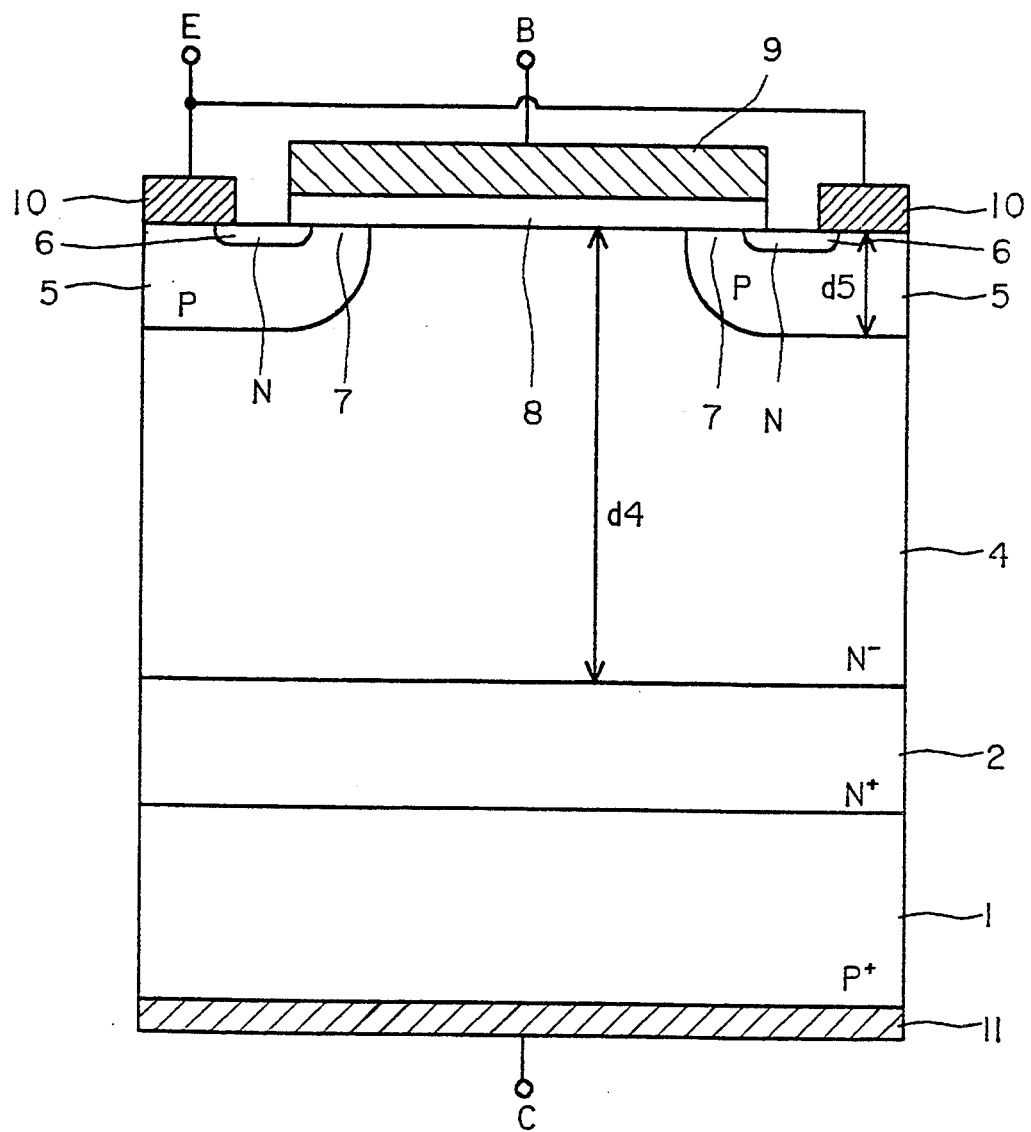
FIG. 1 is a sectional view showing the structure of an N-channel IGBT according to a first embodiment of the present invention.

FIG. 1 is a sectional view showing the structure of an N-channel IGBT according to a first embodiment of the present invention. As shown in FIG. 1, an $N^+$-type buffer layer 2 having impurity concentration of $10^{17}$ $cm^{-3}$ order is formed on a surface of a $P^+$-type substrate 1 of silicon, and an $N^-$-type layer 4 is formed on the $N^+$-type buffer layer 2.

P-type base regions 5 are selectively formed in a surface of the $N^-$-type layer 4, and N-type emitter regions 6 are selectively formed in surfaces of the respective P-type base regions 5. A gate insulating film 8 is formed over an end of the emitter region 6 in one of the P-type base regions 5, this P-type base region 5, a portion of the $N^-$-type layer 4 located between the P-type base regions 5, the other P-type base region 5 and an end of the emitter region 6 in this P-type base region 5, and a gate electrode 9 is formed on the gate insulating film 8. In other words, an N-channel DMOS is formed on the surface of the $N^-$-type layer 4. All semiconductors forming the $P^+$-type substrate 1, the $N^+$-type buffer layer 2, the $N^-$-type layer 4, the P-type base regions 5 and the N-type emitter regions 6 are prepared from silicon.

Emitter electrodes 10 are formed on parts of the P-type base regions 5 and the N-type emitter regions 6, while a collector electrode 11 is formed on a rear surface of the $P^+$-type substrate 1.

In such a structure, a collector voltage $V_{CE}$ of a prescribed level is applied across the emitter electrodes 10 and the collector electrode 11 while grounding the emitter side, and a gate voltage $V_{GE}$ of an operating level is applied across the gate electrode 9 and the emitter electrodes 10. Thus, channel regions 7, which are surface regions of the P-type base regions 5 located under the gate electrode 9, are inverted to N-types. Therefore, electrons from the emitter electrodes 10 are injected into the $N^-$-type layer 4 through the channel regions 7. The $P^+$-type substrate 1 and the $N^-$-type layer 4 are forward biased by the electrons injected into the $N^-$-type layer 4. As the result, the $P^+$-type substrate 1 injects holes into the $N^-$-type layer 4, whereby resistance of the $N^-$-type layer 4 is remarkably reduced and current capacitance of the device is increased. This is an ON state of the IGBT.

When a gate voltage of a non-operating level is applied to the gate electrode 9, on the other hand, the channel regions 7 return to P-types and the IGBT enters an OFF state.

In a typical conventional 600 V system IGBT which operates with a collector-to-emitter voltage $V_{CE}$ of 300 V, the $N^-$-type layer 4 has resistivity $\rho$ of 30$\Omega$ cm (impurity concentration: $1.57 \times 10^{14}$ $cm^{-3}$) and a thickness of 60 $\mu m$, as described above with reference to the prior art.

In the 600 V system IGBT according to the first embodiment of the present invention, on the other hand, the $N^-$-type layer 4 is set to have resistivity $\rho$ of 20$\Omega$ cm (impurity concentration: $2.35 \times 10^{14}$ $cm^{-3}$) and a thickness d4 of 65 $\mu m$. In both of the conventional and inventive IGBTs, the P-type base regions 5 have thicknesses d5 of 10 $\mu m$.

In the IGBT according to the first embodiment of the present invention, the thickness d4 and impurity concentration of the $N^-$-type layer 4 and the thickness d5 of the P-type base regions 5 are set at the above values for the following reasons:

In a turn-off time, a surge voltage may conceivably be caused since an electric field which is applied to the $N^+$-type buffer layer 2 is abruptly increased as soon as depletion layers extending from P-N junctions between the $N^-$-type layer 4 and the P-type base regions 5 reach the $N^+$-type buffer layer 2.

In the IGBT according to the first embodiment of the present invention, therefore, the depletion layers extending from the P-N junctions between the N⁻-type layer 2 and the P-type base regions 5 are reliably prevented from reaching the N⁺-type buffer layer 2 in a turn-off time.

Assuming that BV represents a collector-to-emitter voltage in an actual operation, a space-charge region (extension of depletion layer) W from the P-N junction formed in the interface between each P-type base region 5 and the N⁻-type layer 4 is decided by the following equation (5) in an OFF-state IGBT: where N represents impurity concentration of the N⁻-type layer 4, KSi represents the relative dielectric constant of silicon, ε0 represents the dielectric $$W = \sqrt{\frac{2 \cdot KSi \cdot \epsilon 0}{q \cdot N} BV} \quad (5)$$

constant of a vacuum, and q represents the amount of charges of electrons. It is assumed here that KSi=11.7, ε0=8.854×10⁻¹⁴ (F/cm) and q=1.602×10⁻¹⁹ (C).

The extension W of the depletion layer from the P-N junction between each P-type base region 5 and the N⁻-type layer 4 in the turn-off time of the IGBT according to the first embodiment of the present invention is calculated as 40.6 μm in accordance with the equation (5). Thus, a relation of (65-10)>W (=40.6) holds and hence the depletion layers are reliably prevented from reaching the N⁺-type buffer layer 2 in the turn-off time.

With the impurity concentration of the N⁻-type layer 4 provided in the conventional IGBT, on the other hand, the extension of each depletion layer in a turn-off time is calculated as 49.7 μm from the equation (5). When the P-type regions 5 are formed with ordinary thicknesses of about 10 μm, therefore, a relation of about (60-10)=W holds and hence the deletion layers reach the N⁺-type buffer layer 2 in the turn-off time.

Figure 2:
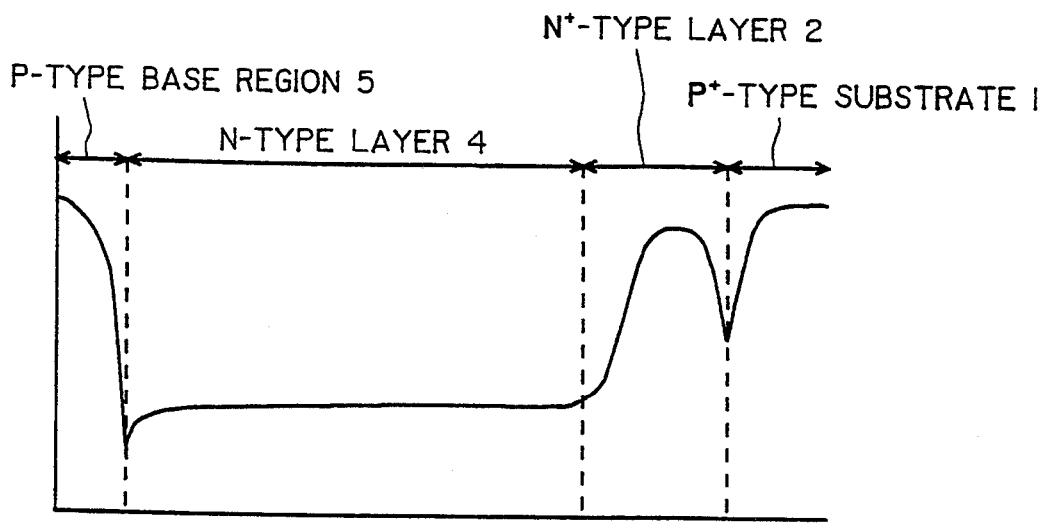
FIG. 2 is a graph showing impurity concentration distribution of the IGBT according to the first embodiment of the present invention.
Figure 3:
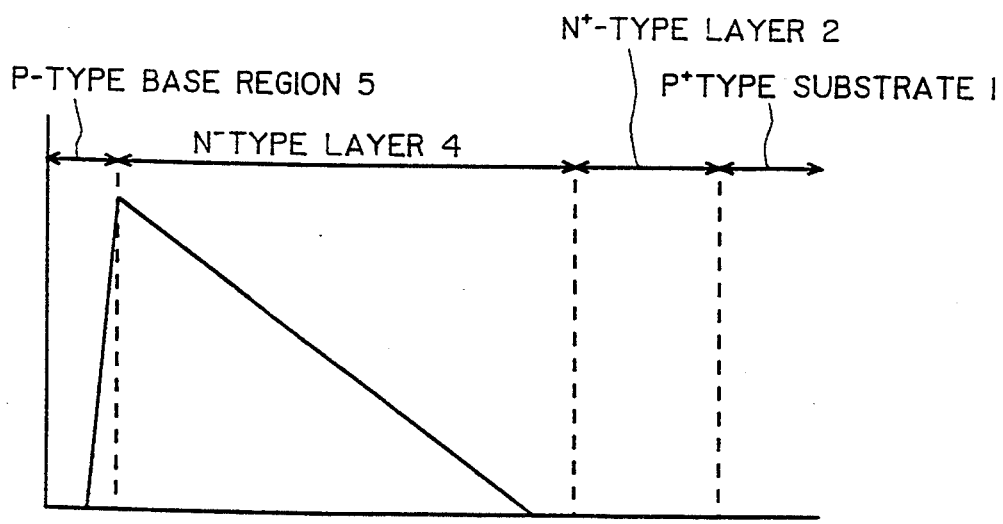
FIG. 3 is a graph showing field distribution of the IGBT according to the first embodiment of the present invention in actual use (OFF state)
Figure 5:
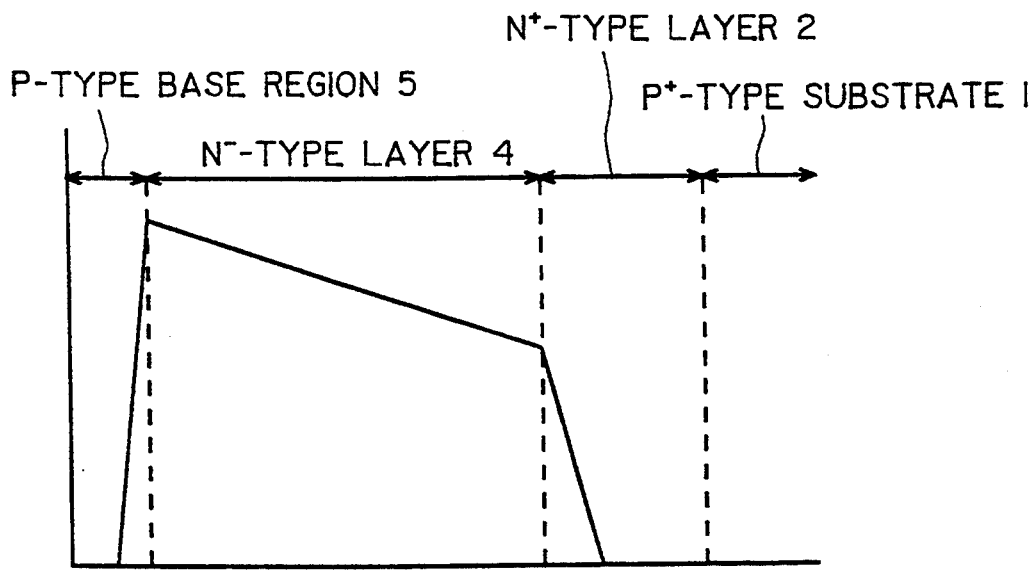
FIG. 5 is a graph showing field distribution of the conventional IGBT in actual use (OFF state)
Figure 6:
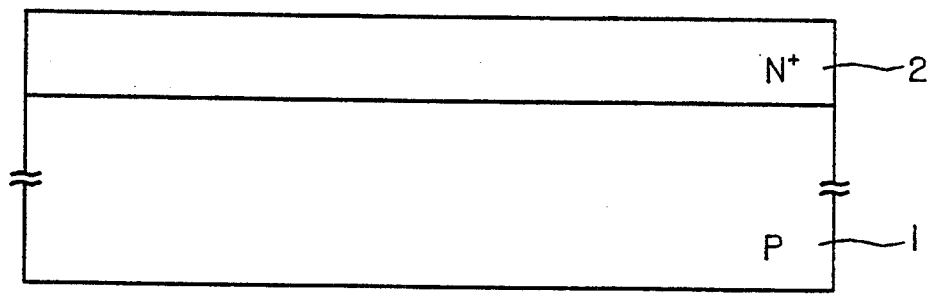
FIG. 6 is a sectional view showing a method of fabricating the IGBT according to the first embodiment of the present invention.

FIG. 2 is a graph showing impurity concentration distribution of the IGBT according to the first embodiment of the present invention, and FIG. 3 is a graph showing field distribution of the IGBT according to first embodiment upon application of a collector-to-emitter voltage in an actual operation (OFF state). FIG. 5 is a graph showing impurity concentration distribution of the conventional IGBT, and FIG. 6 is a graph showing field distribution of the conventional IGBT upon application of a collector-to-emitter voltage in an actual operation (OFF state).

Figure 4:
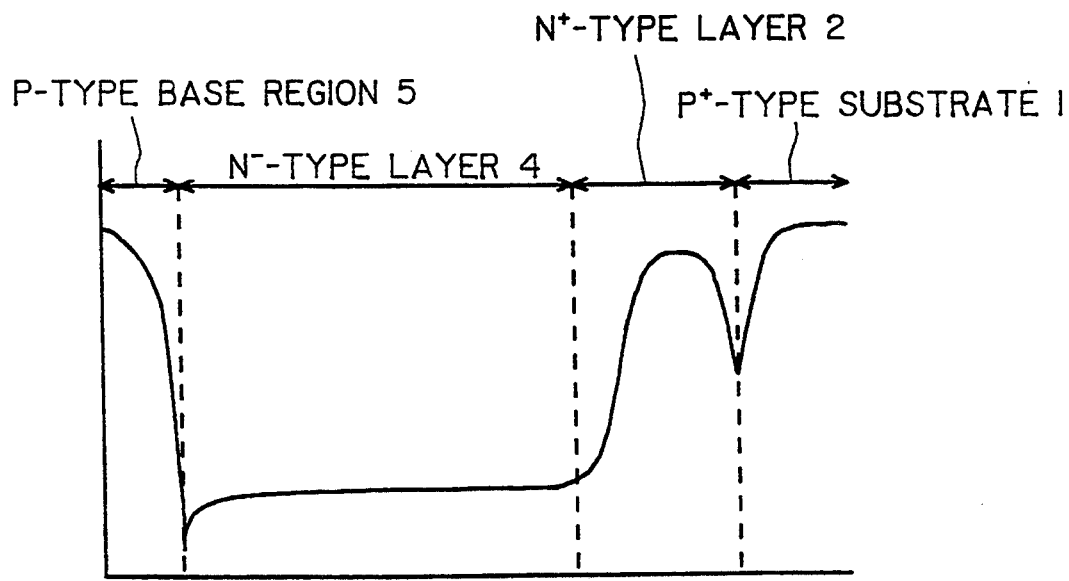
FIG. 4 is a graph showing impurity concentration distribution of a conventional IGBT.

Comparing FIGS. 2 and 4 with each other, the IGBT according to the first embodiment of the present invention is set to be higher in impurity concentration and larger in thickness of the N⁻-type layer 4 as compared with the conventional IGBT. Therefore, the electric field which is applied to the N⁺-type buffer layer 2 is reliably zeroed in the IGBT according to the first embodiment of the present invention, as understood from comparison of FIGS. 3 and 5. Thus, the depletion layers extending from the P-N junctions between the P-type base regions 5 and the N⁻-type layer 4 will not reach the N⁺-type buffer layer 2 in a turn-off time of the IGBT according to the first embodiment of the present invention.

The inventor experimentally fabricated an IGBT of 100 A in accordance with the first embodiment, to evaluate a surge voltage in a switching-off state of the IGBT in a half bridge circuit under measurement conditions of $V_{CE}$ of 300 V, $V_{GE}$ of ±15 V and a junction temperature (device temperature) of 125° C. The junction temperature was set at 125° C. since such a junction temperature is increased to about 125° C. by heat generation in actual use.

As the result of evaluation, a surge voltage of about 450 V was measured. Thus, it has been possible to suppress such a surge voltage by about 100 V as compared with the conventional IGBT.

While increase in thickness d4 of the N⁻-type layer 4 may lead to increase in collector saturation voltage $V_{CE}(sat)$, such increase of the collector saturation voltage $V_{CE}(sat)$ remains at a negligible level if the thickness d4 is increased merely by about 5 μm. Also when the thickness d4 of the N⁻-type layer 4 is set at 60 μm similarly to the conventional IGBT, a relation (65-10)>W (=40.6) holds and hence it is possible to suppress increase of the collector saturation voltage $V_{CE}(sat)$ as well as to suppress the surge voltage.

FIGS. 6 to 17 are sectional views showing a method of fabricating the IGBT according to the first embodiment of the present invention. The fabrication method is now described with reference to these figures.

Figure 7:
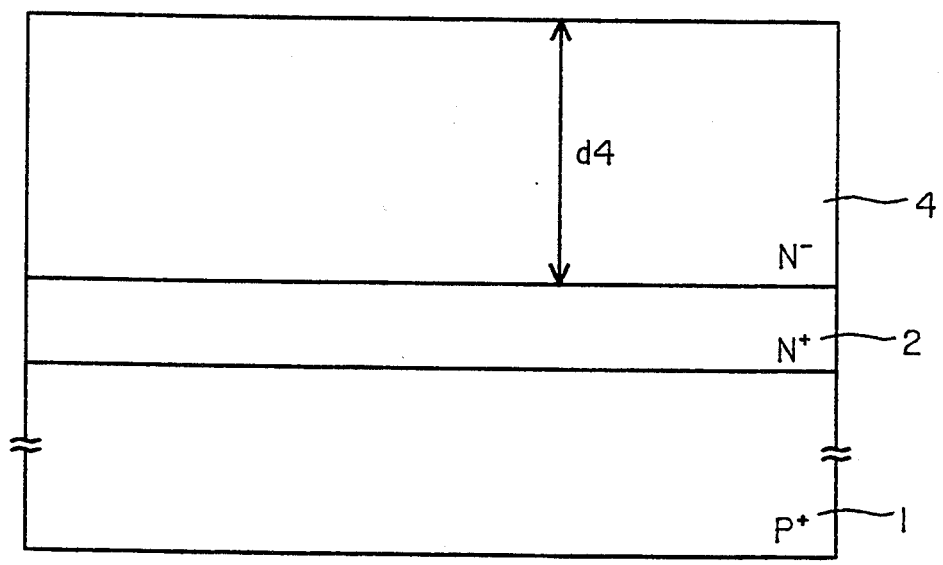
FIG. 7 is a sectional view showing the method of fabricating the IGBT according to the first embodiment of the present invention.

First, a P⁺-type substrate 1 is prepared and an N⁺-type buffer layer 2 having impurity concentration of 10¹⁷ cm⁻³ order is formed on the P⁺-type substrate 1 by epitaxial growth, as shown in FIG. 6. Then, an N⁻-type layer 4 having impurity concentration of 2.35×10¹⁴ cm⁻³ with a thickness d4 of 65 μm is formed on the N⁺-type buffer layer 2 by epitaxial growth, as shown in FIG. 7.

Figure 8:
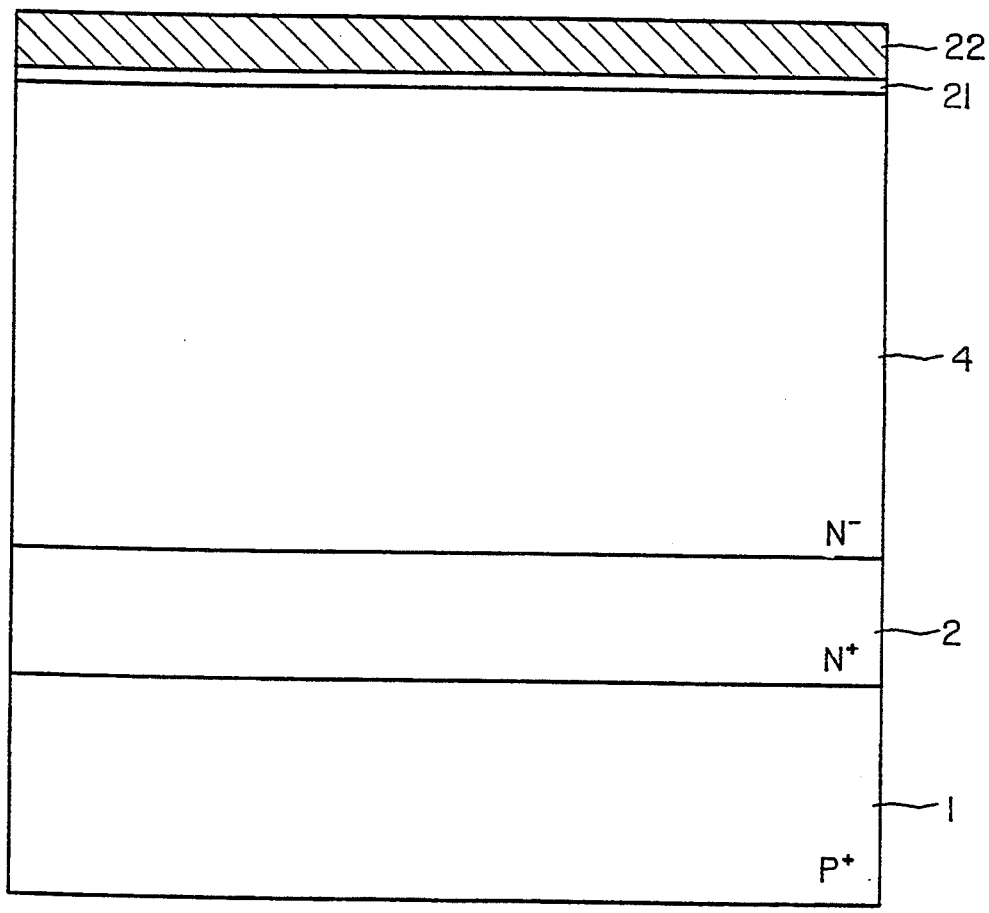
FIG. 8 is a sectional view showing the method of fabricating the IGBT according to the first embodiment of the present invention.
Figure 9:
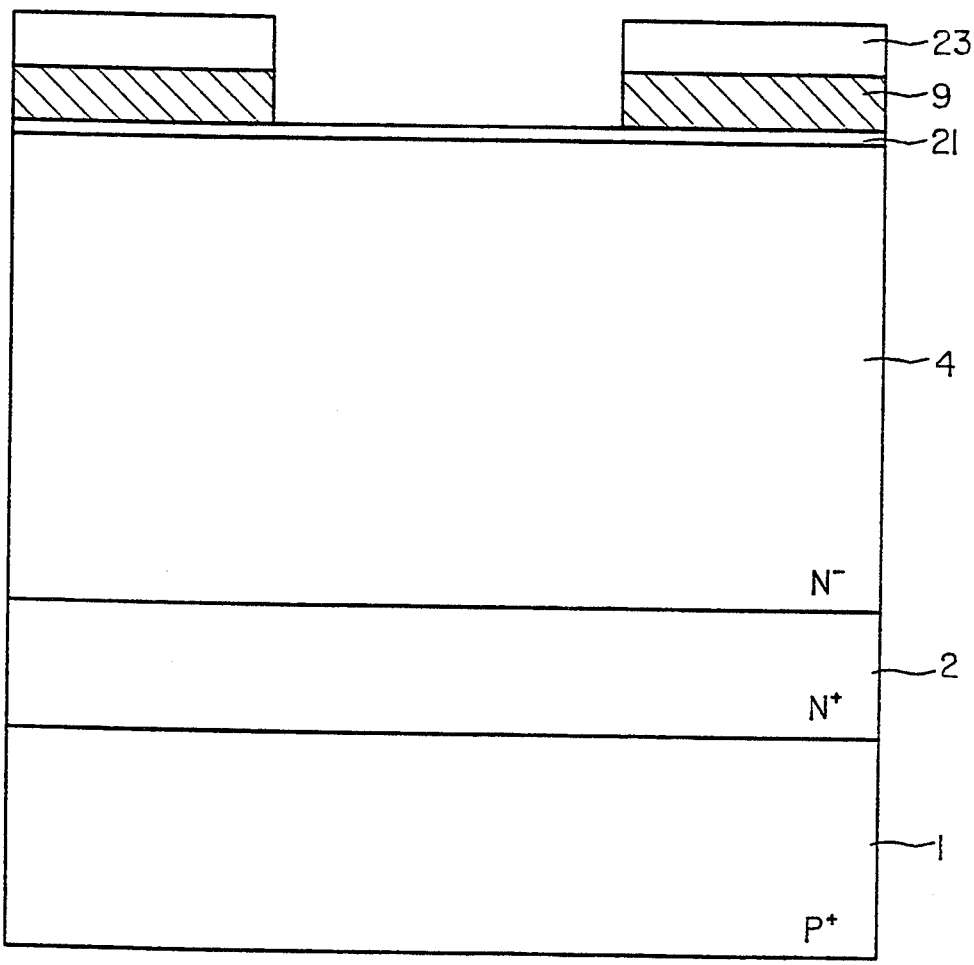
FIG. 9 is a sectional view showing the method of fabricating the IGBT according to the first embodiment of the present invention.

Then, a thin oxide film 21 is formed over the entire surface of the N⁻-type layer 4, and a polysilicon layer 22 is formed on the oxide film 21, as shown in FIG. 8. Then, resist films 23 are applied and then patterned. Thereafter the patterned resist films 23 are used as masks to etch the polysilicon layer 22, thereby forming gate electrodes 9 of polysilicon, as shown in FIG. 9.

Figure 10:
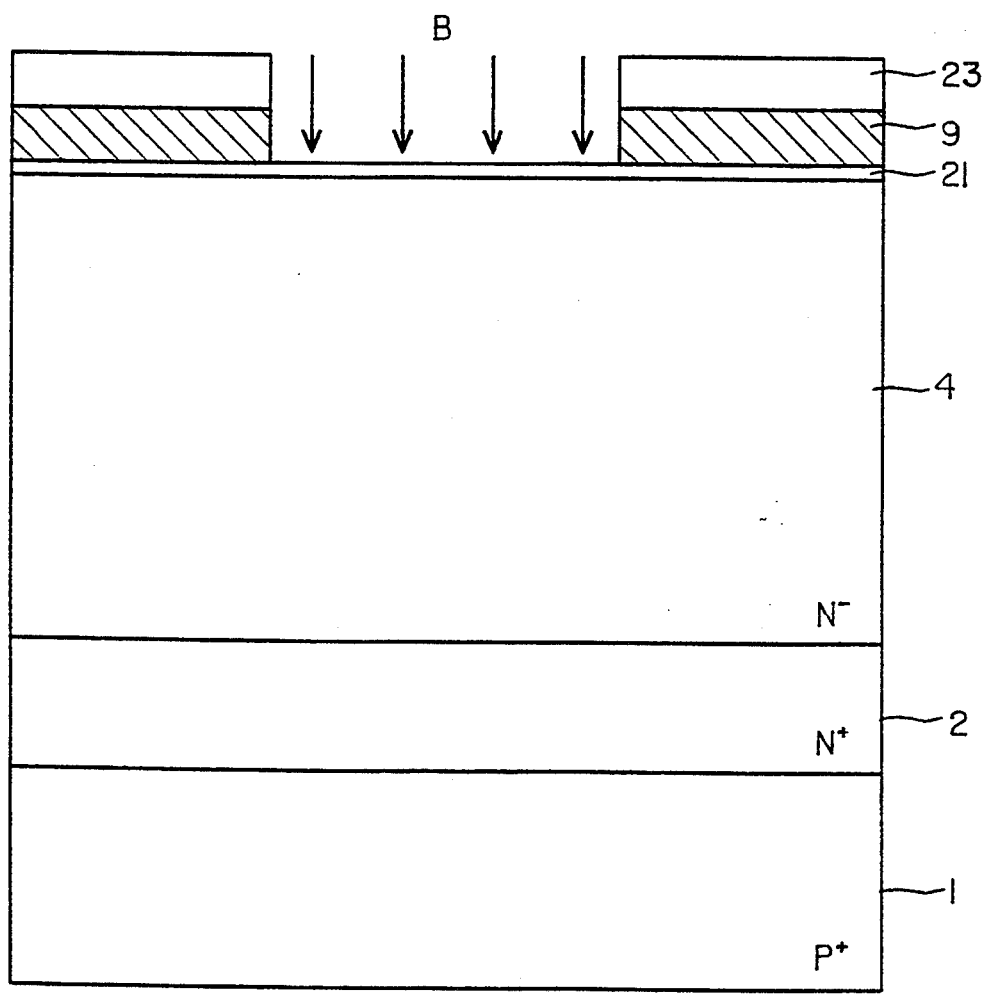
FIG. 10 is a sectional view showing the method of fabricating the IGBT according to the first embodiment of the present invention.
Figure 11:
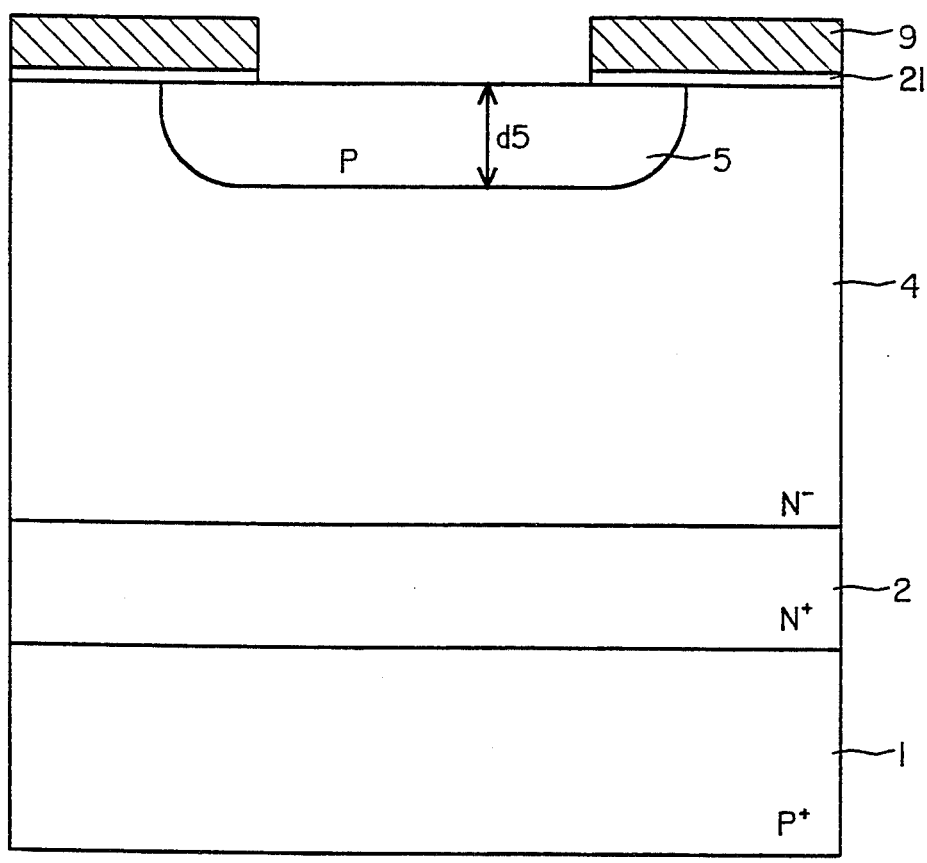
FIG. 11 is a sectional view showing the method of fabricating the IGBT according to the first embodiment of the present invention.

Thereafter the resist films 23 and the gate electrodes 9 are employed as masks to implant boron into the surface of the N⁻-type layer 4, as shown in FIG. 10. The resist films 23 are removed and annealing is performed to form a P-type base region 5 having a thickness d5 of 10 μm, as shown in FIG. 11. At this time, parts of the P-type base region 5 are formed under the oxide films 21 by thermal diffusion.

Figure 12:
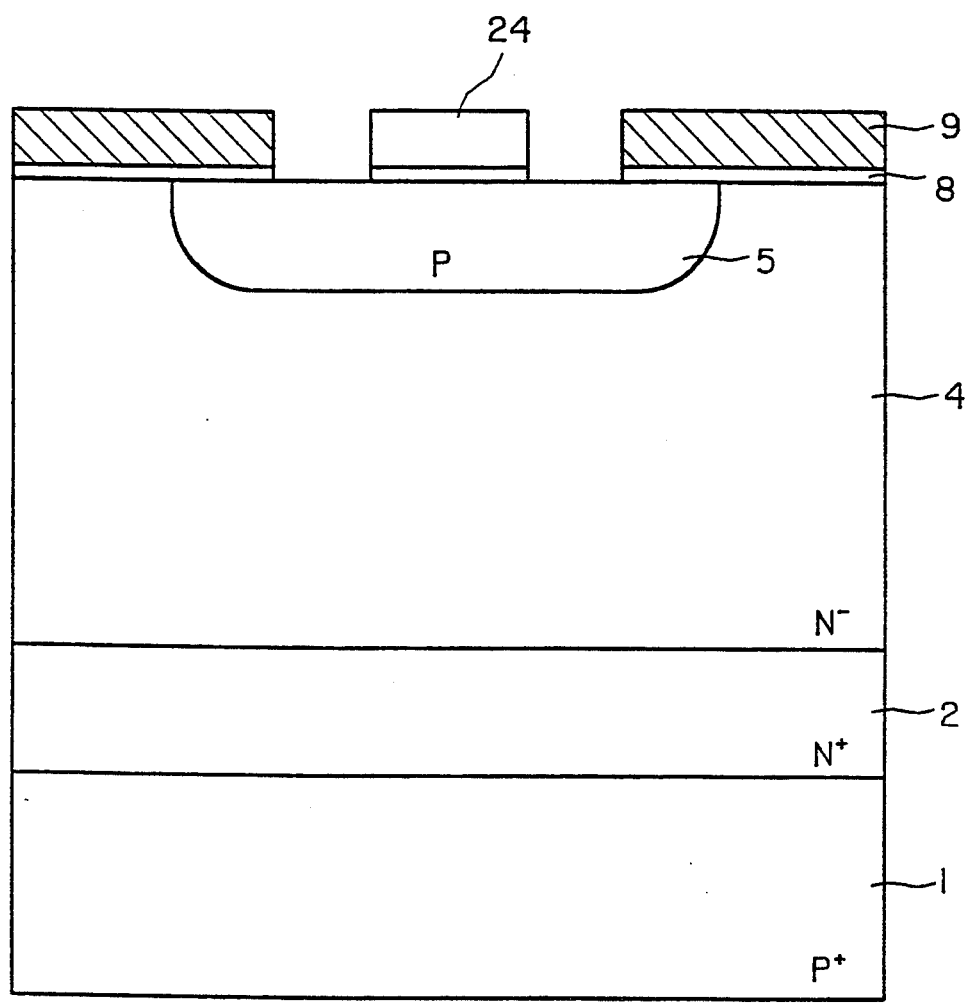
FIG. 12 is a sectional view showing the method of fabricating the IGBT according to the first embodiment of the present invention.

Then, a resist film 24 is applied over the entire surface, and then patterned. Thereafter the resist film 24 and the gate electrodes 9 are employed as masks to etch the oxide films 21, thereby forming gate oxide films 8, as shown in FIG. 12.

Figure 13:
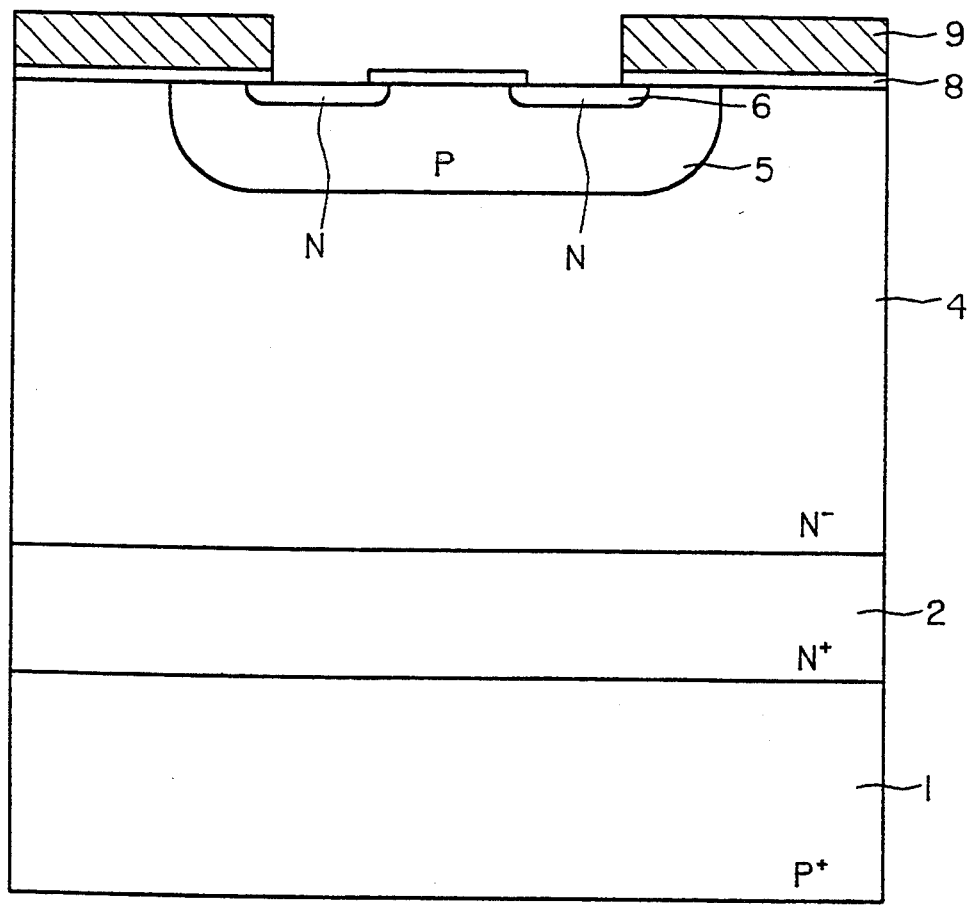
FIG. 13 is a sectional view showing the method of fabricating the IGBT according to the first embodiment of the present invention.

Then the resist films 24 are removed and the gate electrodes 9 and the gate oxide films 8 are employed as masks to deposit phosphorus, and heat treatment is performed, thereby forming N-type emitter regions 6 as shown in FIG. 13. The N-type emitter regions 6 may alternatively be formed by implanting phosphorus, removing the resist films 24 and performing annealing, similarly to the P-type base region 5.

Figure 14:
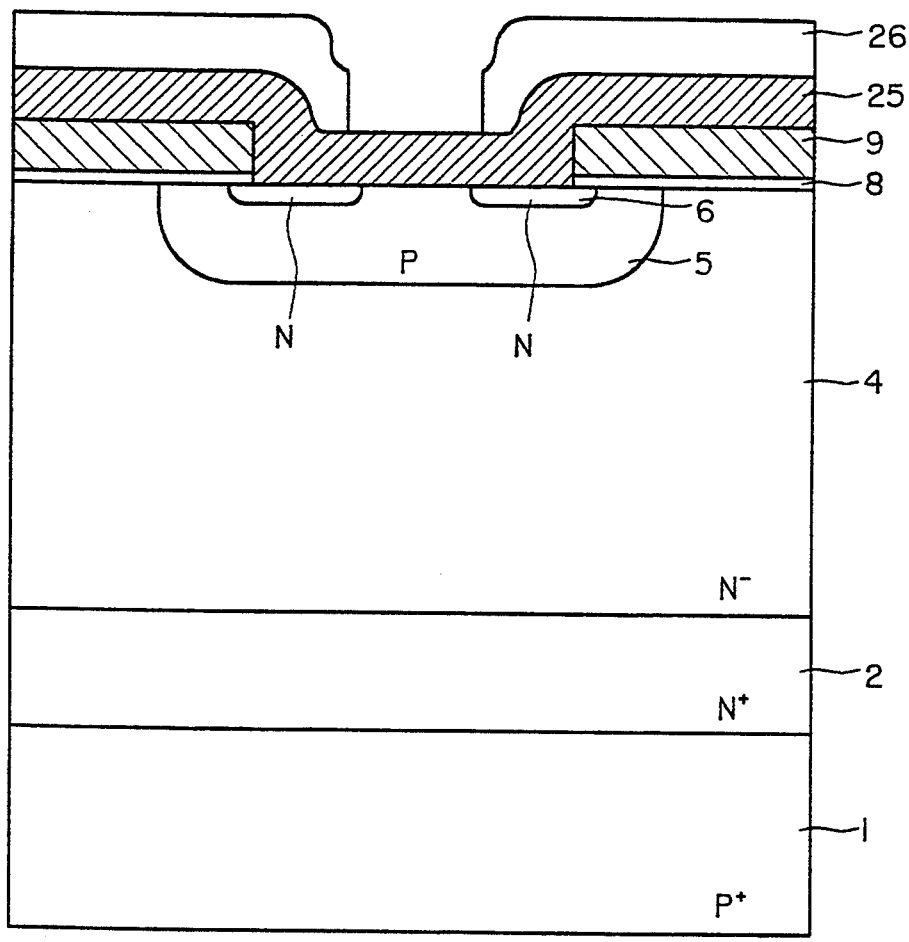
FIG. 14 is a sectional view showing the method of fabricating the IGBT according to the first embodiment of the present invention.

Then, an interlayer insulating film 25 is formed over the entire surface, as shown in FIG. 14. Resist films 26 are applied onto the interlayer insulating film 25, and then patterned.

Figure 15:
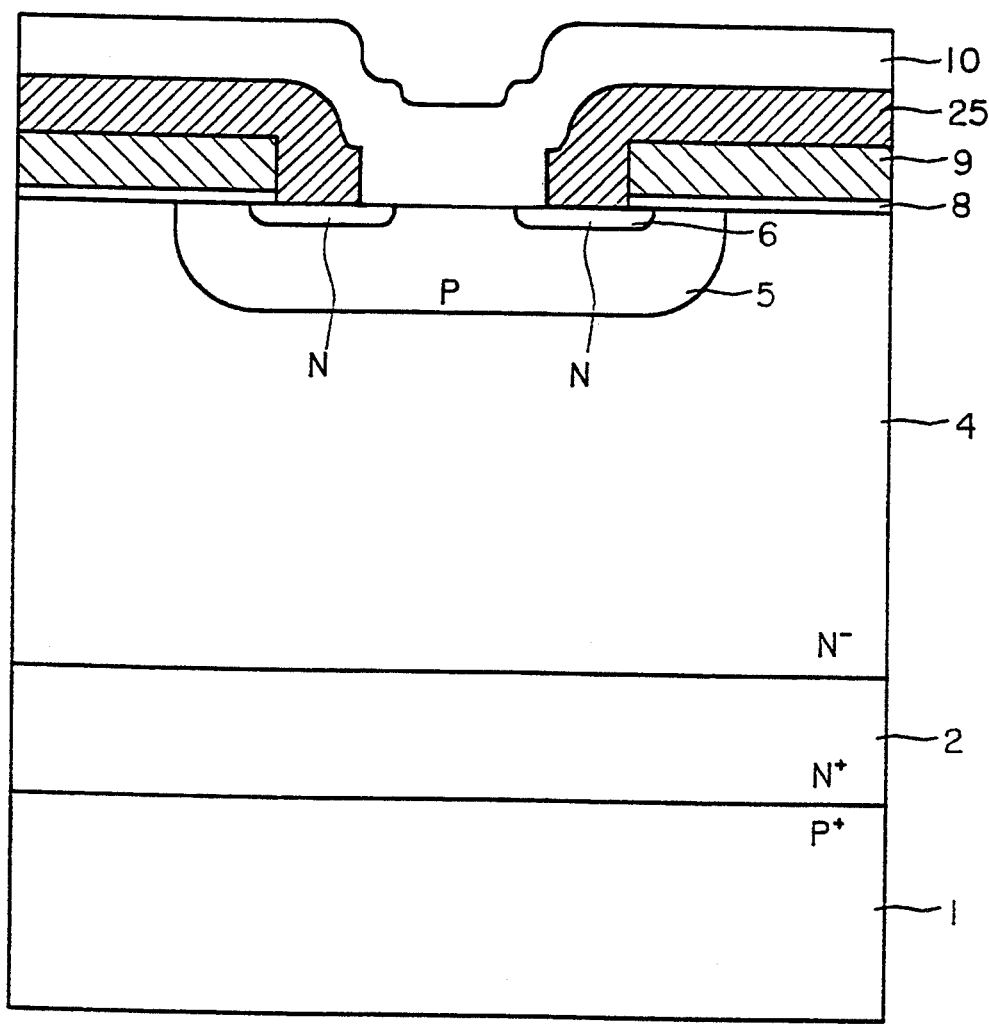
FIG. 15 is a sectional view showing the method of fabricating the IGBT according to the first embodiment of the present invention.
Figure 16:
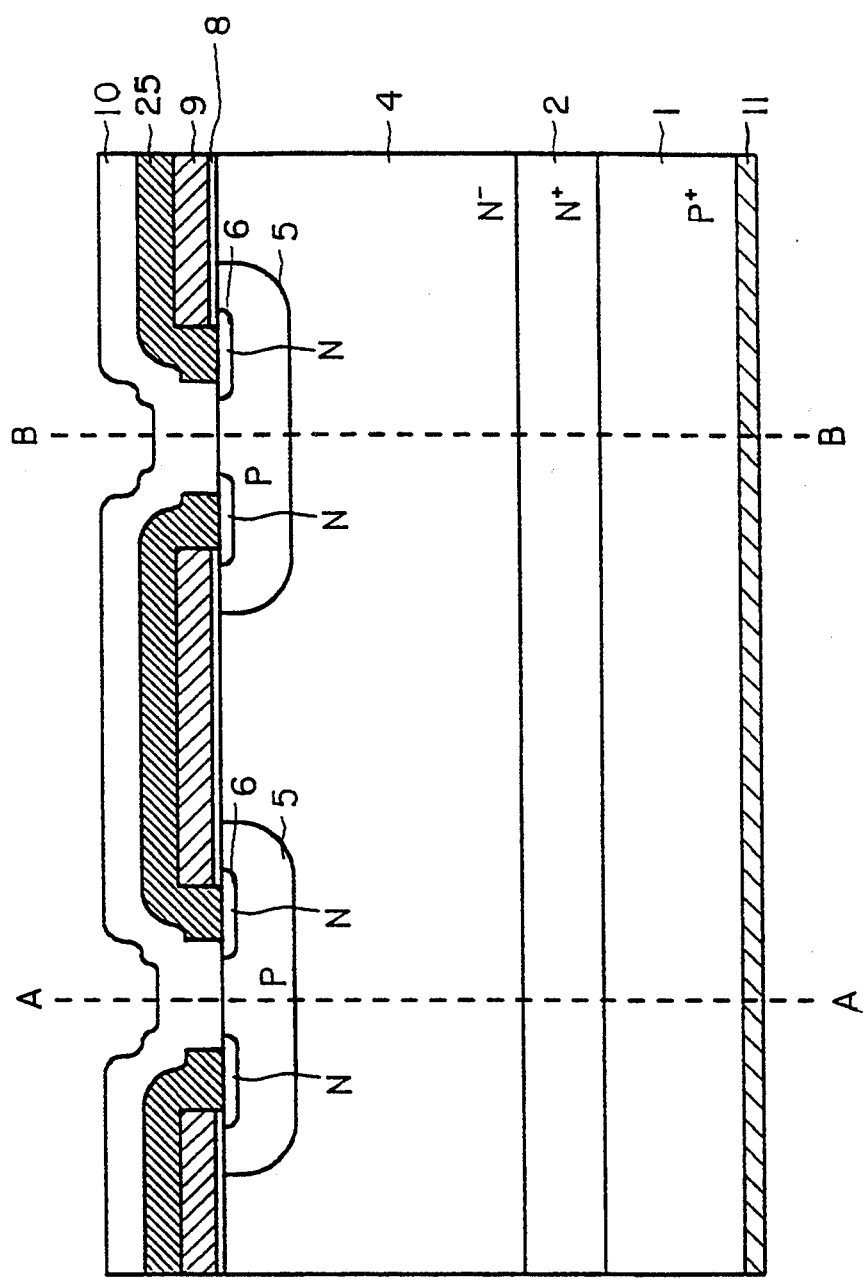
FIG. 16 is a sectional view showing the method of fabricating the IGBT according to the first embodiment of the present invention.

Then, the patterned resist films 26 are employed as masks to etch the interlayer insulating film 25, thereby exposing parts of the N-type emitter regions 6 and a portion of the P-type base region 5 located between the N-type emitter regions 6, as shown in FIG. 15. Thereafter an emitter electrode 10 is formed over the entire surface.

Finally, a collector electrode 11 is formed on a rear surface of the P+-type substrate 1, to complete the IGBT according to the first embodiment of the present invention. A section taken along the lines A—A or B—B in FIG. 16 corresponds to FIG. 1, in which the interlayer insulating film 25 is omitted and the emitter electrodes 10 are typically illustrated.

In the first embodiment, the impurity concentration and the thickness d4 of the N⁻-type layer 4 and the thickness d5 of the P-type base region 5 are set at $2.35 \times 10^{14}$ cm$^{-3}$, 65 $\mu$m and 10 $\mu$m respectively. However, the present invention is not restricted to this but such values may be arbitrarily set in a range satisfying (d4−d5)>W (calculated from the equation (5)), to obtain an IGBT which can suppress a surge voltage.

Figure 17:
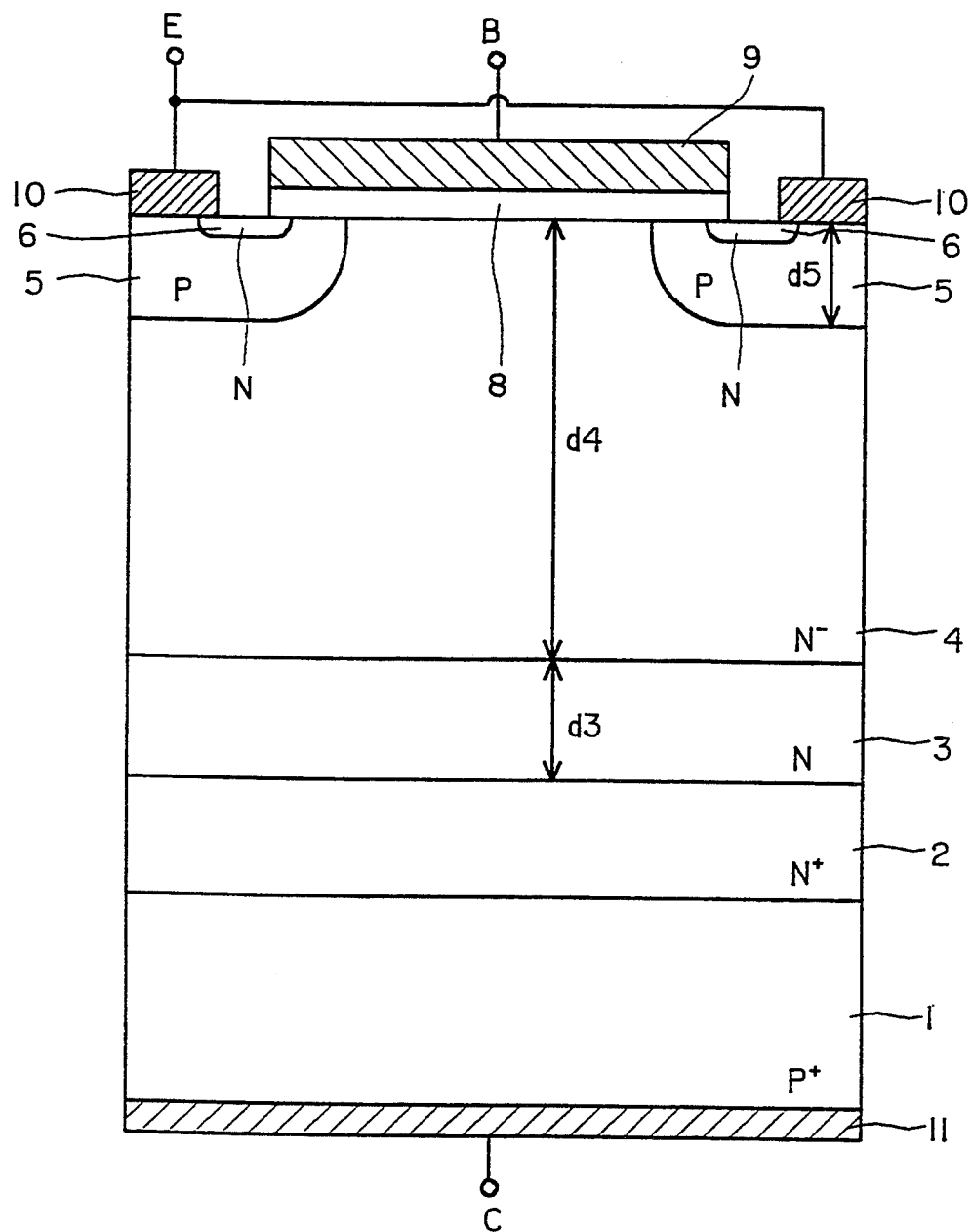
FIG. 17 is a sectional view showing the structure of an N-channel IGBT according to a second embodiment of the present invention.

FIG. 17 is a sectional view showing the structure of an N-channel IGBT according to a second embodiment of the present invention. As shown in FIG. 17, an N+-type buffer layer 2 having impurity concentration of $10^{17}$ cm$^{-3}$ order is formed on a P+-type substrate 1. An N-type layer 3 is formed on the N+-type buffer layer 2, and an N⁻-type layer 4 is formed on the N-type layer 3. All semiconductors forming the P+-type substrate 1, the N+-type buffer layer 2, the N-type layer 3, the N⁻-type layer 4, P-type base regions 5 and N-type emitter regions 6 are prepared from silicon.

The P-type base regions 5 are selectively formed in a surface of the N⁻-type layer 4, and the N-type emitter regions 6 are selectively formed in surfaces of the P-type base regions 5. Similarly to the first embodiment, a gate insulating film 8 is formed over end portions of the P-type base regions 5, so that a gate electrode 9 is formed on this gate insulating film 8. Namely, an N-channel DMOS is formed on the surface of the N⁻-type layer 4. Emitter electrodes 10 are formed on parts of the P-type base regions 5 and the N-type emitter regions 6, while a collector electrode 11 is formed on a rear surface of the P+-type substrate 1.

In the IGBT according to the second embodiment of the present invention, the N⁻-type layer 4 has a thickness d4 of 50 $\mu$m and impurity concentration of $1.57 \times 10^{14}$ cm$^{-3}$ (30Ω cm), the P-type base regions 5 have thicknesses d5 of 10 $\mu$m, and the N-type layer 3 has a thickness d3 of 10 $\mu$m and impurity concentration of $2.35 \times 10^{14}$ cm$^{-3}$ (20Ω cm).

Similarly to the first embodiment, the thickness d4 and the impurity concentration of the N⁻-type layer 4, the thickness d3 and the impurity concentration of the N-type layer 3 and the thicknesses d5 of the P-type base regions 5 are set as described above for the following reasons:

In the IGBT according to the second embodiment of the present invention, depletion layers extending from P-N junctions between the N⁻-type layer 4 and the P-type base regions 5 are prevented from reaching the N+-type buffer layer 2 in a turn-off time, in order to suppress a surge voltage.

Assuming that BV represents a collector-to-emitter voltage in an actual operation, a space-charge region W' from the P-N junction formed in the interface between each P-type base region 5 and the N⁻-type layer is decided by the following equations (6):

$$W' = W1 + W2 \quad (6)$$

$$W1 = \sqrt{\frac{2 \cdot KSi \cdot \epsilon 0}{q \cdot N}} BV1$$

$$W2 = \sqrt{\frac{2 \cdot KSi \cdot \epsilon 0}{q \cdot N2}} (BV - BV1)$$

where N1 represents impurity concentration of the N⁻-type layer 4, N2 represents impurity concentration of the N-type layer 3, KSi represents the relative dielectric constant of silicon, $\epsilon 0$ represents the dielectric constant of a vacuum, q represents the amount of charges of electrons, and BV1 represents a collector-to-emitter voltage which is shared across the P-type base regions 5 and the N⁻-type layer 4.

In the structure according to the second embodiment, BV1 of 194.4 V is calculated since W1=40 $\mu$m. Consequently, W2 of 7.6 $\mu$m is calculated and hence extension W' (W1+W2) of the depletion layer from the P-N junction in the interface between each P-type base region 5 and the N⁻-type layer 4 in a turn-off time of the IGBT according to the second embodiment is calculated as 47.6 $\mu$m.

Hence, a relation of (50−10)+10>47.6 holds, whereby the depletion layers will not reach the N+-type buffer layer 2 in a turn-off time.

Figure 18:
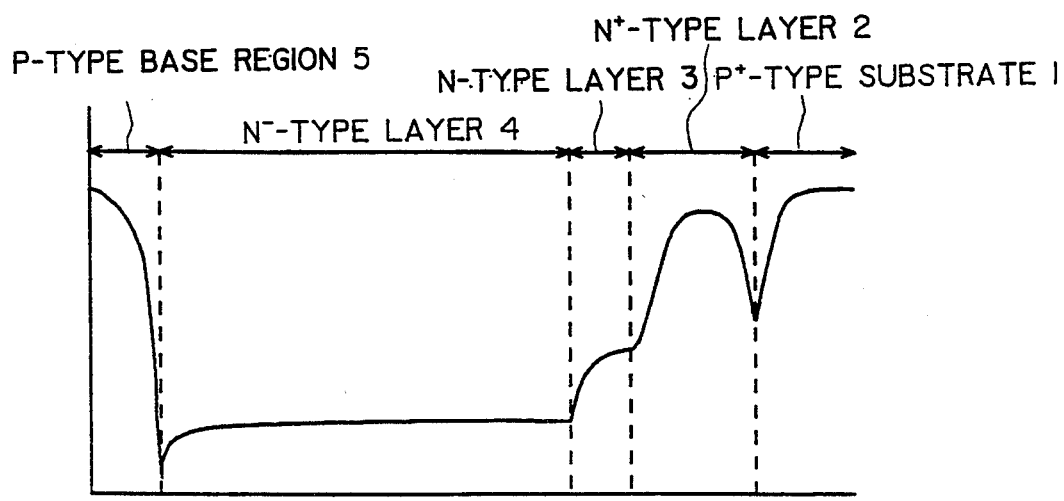
FIG. 18 is a graph showing impurity concentration distribution of the IGBT according to the second embodiment of the present invention.
Figure 19:
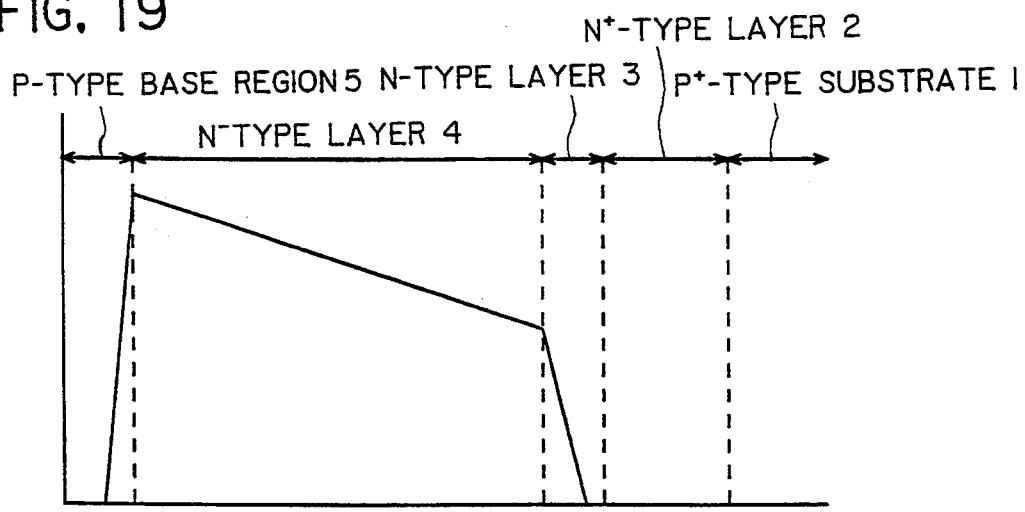
FIG. 19 is a graph showing field distribution of the IGBT according to the second embodiment of the present invention in actual use (OFF state)

FIG. 18 is a graph showing impurity concentration distribution of the IGBT according to the second embodiment, and FIG. 19 is a graph showing field distribution of the IGBT according to the second embodiment upon application of a collector-to-emitter voltage in an actual operation (OFF state).

As shown in FIG. 18, the electric field is reliably zeroed in the N-type layer 3. Thus, it is understood that the depletion layers extending from the P-N junctions between the P-type base regions 5 and the N⁻-type layer 4 are reliably prevented from reaching the N+-type buffer layer 2 in a turn-off time.

Thus, it is possible to suppress a surge voltage for a reason similar to that in the IGBT according to the first embodiment of the present invention.

Figure 20:
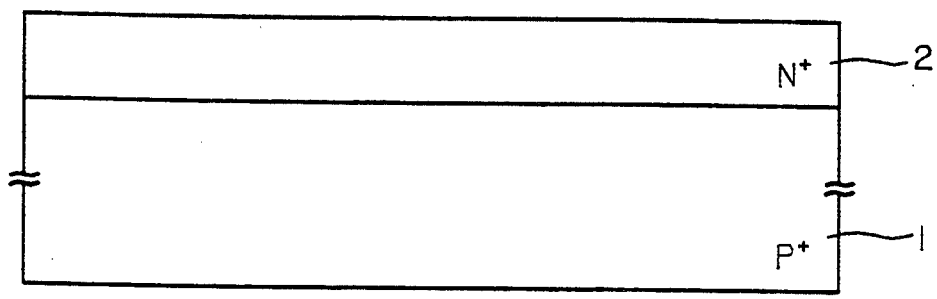
FIG. 20 is a sectional view showing a method of fabricating the IGBT according to the second embodiment of the present invention.
Figure 21:
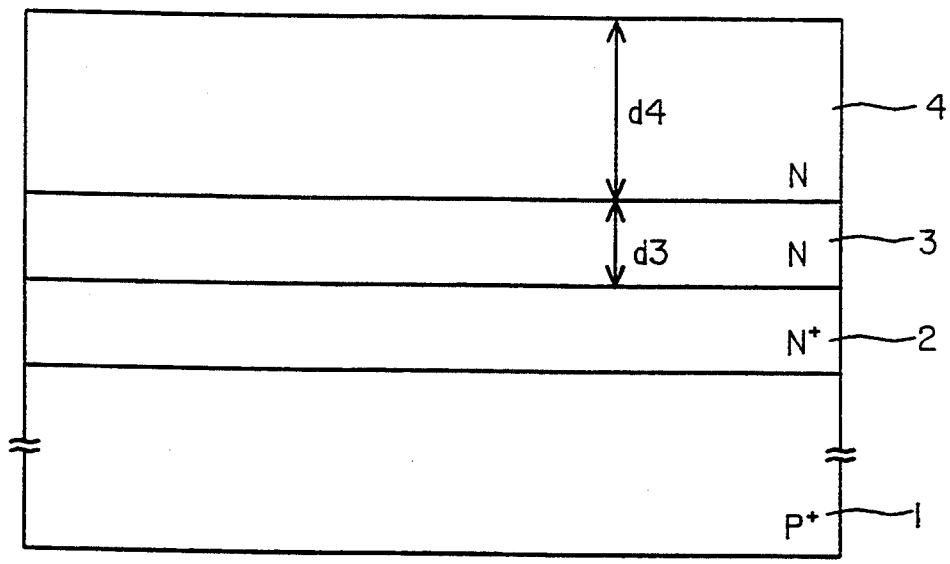
FIG. 21 is a sectional view showing the method of fabricating the IGBT according to the second embodiment of the present invention.
Figure 22:
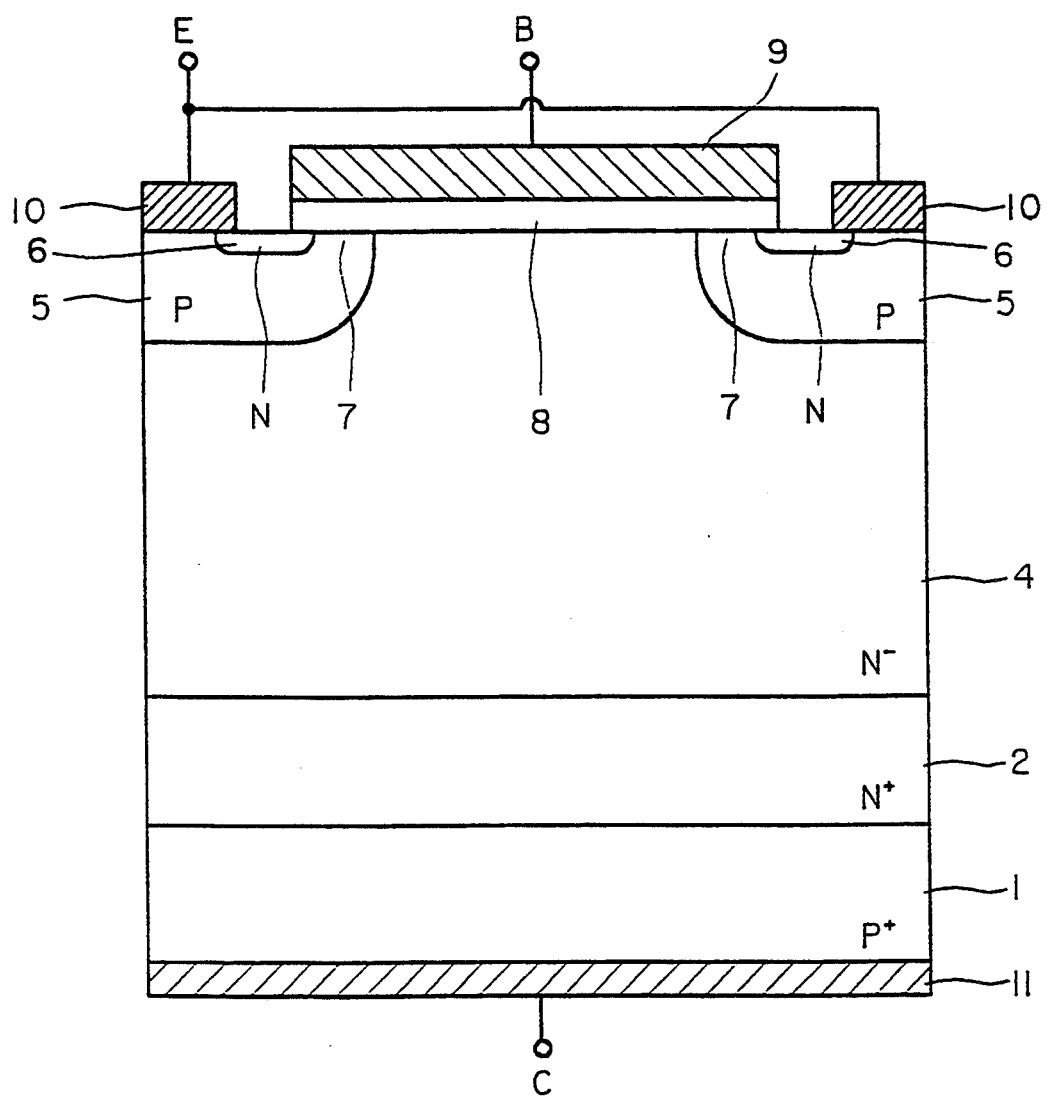
FIG. 22 is a sectional view showing the structure of a conventional IGBT.

FIGS. 20 and 21 are sectional views partially showing a method of fabricating the IGBT according to the second embodiment of the present invention. This fabricating method is now described with reference to these figures.

First, a P+-type substrate 1 is prepared, and an N+-type buffer layer 2 having impurity concentration of $10^{17}$ cm$^{-3}$ order is formed thereon by epitaxial growth, as shown in FIG. 20. Then, an N-type layer 3 having impurity concentration of $2.35 \times 10^{14}$ cm$^{-3}$ and a thickness d3 of 10 $\mu$m is formed on the N+-type buffer layer 2 by epitaxial growth, as shown in FIG. 21. Further, an N⁻-type layer 4 having impurity concentration of $1.57 \times 10^{14}$ cm$^{-3}$ and a thickness d4 of 50 $\mu$m is formed on the N-type layer 3 by epitaxial growth.

Then, a DMOS is formed on a surface of the N⁻-type layer 4 along the steps (see FIGS. 8 to 16) illustrated with reference to the first embodiment, to complete the IGBT according to tile second embodiment. At this time, P-type base regions 5 are formed with thicknesses d5 of 10 $\mu$m.

According to the second embodiment, the impurity concentration and the thickness d3 of the N-type layer 3, the impurity concentration and the thickness d4 of the N⁻-type layer 4 and the thicknesses d5 of the P-type base regions 5 are set at $2.35 \times 10^{14}$ cm$^{-3}$, 10 $\mu$m, $1.57 \times 10^{14}$ cm$^{-3}$, 50 μm and 10 μm respectively. However, the present invention is not restricted to this but such values can be arbitrarily set in a range satisfying (d4−d5+d3)>W' (calculated from the equations (6)), to obtain an IGBT which can suppress a surge voltage.

Although the first and second embodiments have been described with reference to IGBTs, the present invention is also applicable to a MOS gate thyristor such as a power MOSFET, MCT (MOS controlled thyristor), EST (emitter switched thyristor), BRT (base resistance controlled thyristor) or the like.

The present invention is basically applicable to a semiconductor device in which a surge voltage is increased when depletion layers extending from P-N junctions reach another adjacent semiconductor layer in application of a reverse bias voltage.

The above equations (5) and (6) hold also when the conductivity types are reverse to those in the first and second embodiments.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:

a first conductivity type first semiconductor layer having one major surface and another major surface;

a first conductivity type second semiconductor layer being formed on said one major surface of said first semiconductor layer and having lower impurity concentration than said first semiconductor layer;

a second conductivity type third semiconductor layer being implanted in a surface of said second semiconductor layer;

a first main electrode being formed on said third semiconductor layer; and a second main electrode being formed on said another major surface of said first semiconductor layer, the thickness of said third semiconductor layer, and the thickness and impurity concentration of said second semiconductor layer being so set as to satisfy the following conditional expression:

D>W assuming that D represents the thickness of said second semiconductor layer being located under said third semiconductor layer, BV represents a reverse bias voltage being applied across said first and second main electrodes in an actual operation, KS represents the relative dielectric constant of a semiconductor material in said second semiconductor layer, ε0 represents the dielectric constant of a vacuum, q represents the amount of charges of electrons, N represents impurity concentration of said second semiconductor layer, and W represents extension of a depletion layer in reverse bias setting of a P-N junction formed in the interface between said second and third semiconductor layers, being determined by the following equation (1):

$$W = \sqrt{\frac{2 \cdot KS \cdot \epsilon 0}{q \cdot N} BV} \quad (1)$$

2. A semiconductor device in accordance with claim 1, further comprising:

a first conductivity type fourth semiconductor layer being selectively implanted in a surface of said third semiconductor layer, an insulating film formed on a surface portion of said third semiconductor layer being located between said fourth and second semiconductor layers, and a control electrode being formed on said insulating film, said first main electrode being an electrode formed on said third and fourth semiconductor layers, said semiconductor device further comprising a second conductivity type semiconductor substrate being formed on said another major surface of said first semiconductor layer, said second main electrode being an electrode formed on said semiconductor substrate.

3. A semiconductor device in accordance with claim 2, wherein a surface portion of said third semiconductor layer being located under said insulating film serves as a channel region in a MOS operation with said control electrode serving as a gate electrode.

4. A semiconductor device in accordance with claim 3, wherein said third semiconductor layer includes a plurality of third semiconductor layers, and said fourth semiconductor layer is implanted in a surface of each of said third semiconductor layers.

5. A semiconductor device in accordance with claim 4, wherein said first main electrode is an emitter electrode and said second main electrode is a collector electrode.

6. A semiconductor device in accordance with claim 5, wherein said first conductivity type is an N-type and said second conductivity type is a P-type.

7. A semiconductor device comprising:

a first conductivity type first semiconductor layer having one major surface and another major surface;

a first conductivity type intermediate semiconductor layer being formed on said one major surface of said first semiconductor layer and having lower impurity concentration than said first semiconductor layer;

a first conductivity type second semiconductor layer being formed on said intermediate semiconductor layer and having lower impurity concentration than said intermediate semiconductor layer;

a second conductivity type third semiconductor layer being implanted in a surface of said second semiconductor layer;

a first main electrode being formed on said third semiconductor layer; and a second main electrode being formed on said another major surface of said first semiconductor layer, the thickness of said third semiconductor layer, the thickness and impurity concentration of said second semiconductor layer, and the thickness and impurity concentration of said intermediate semiconductor layer being so set as to satisfy the following conditional expression:

D'>W' assuming that D' represents the total thickness of said semiconductor layer being located under said third semiconductor layer and said intermediate semiconductor layer, BV represents a reverse bias voltage being applied across said first and second main electrodes in an actual operation, KS represents the relative dielectric constant of a semiconductor material in said second semiconductor layer, $\epsilon 0$ represents the dielectric constant of a vacuum, q represents the amount of charges of electrons, N1 represents impurity concentration of said first semiconductor layer, N2 represents impurity concentration of said second semiconductor layer, BV1 represents a reverse bias voltage being shared across said second and third semiconductor layers, and W' represents extension of a depletion layer in reverse bias setting of a P-N junction formed in the interface between said second and third semiconductor layers, being determined by the following equations (2):

$$W' = W1 + W2 \qquad (2)$$

$$W1 = \sqrt{\frac{2 \cdot KS \cdot \epsilon 0}{q \cdot N1} BV1}$$

$$W2 = \sqrt{\frac{2 \cdot KS \cdot \epsilon 0}{q \cdot N2} (BV - BV1)}.$$

* * * * *